United States Patent
Ngai et al.

(10) Patent No.: US 8,901,961 B1
(45) Date of Patent: Dec. 2, 2014

(54) PLACEMENT, REBUFFERING AND ROUTING STRUCTURE FOR PLD INTERFACE

(71) Applicant: Altera Corporation, San Jose, CA (US)

(72) Inventors: Tony Ngai, Saratoga, CA (US); Arifur Rahman, San Jose, CA (US); Curt Wortman, San Jose, CA (US)

(73) Assignee: Altera Corporation, San Jose, CA (US)

( * ) Notice: Subject to any disclaimer, the term of this patent is extended or adjusted under 35 U.S.C. 154(b) by 0 days.

(21) Appl. No.: 13/687,695

(22) Filed: Nov. 28, 2012

(51) Int. Cl.
*H03K 19/177* (2006.01)
*H01L 25/00* (2006.01)

(52) U.S. Cl.
CPC ................................. *H03K 19/177* (2013.01)
USPC ................. 326/41; 326/39; 326/47; 326/101

(58) Field of Classification Search
None
See application file for complete search history.

(56) References Cited

U.S. PATENT DOCUMENTS

| | | | |
|---|---|---|---|
| 5,341,049 A * | 8/1994 | Shimizu et al. | 326/101 |
| 7,919,845 B2 * | 4/2011 | Karp et al. | 257/686 |
| 7,958,294 B1 * | 6/2011 | Lee | 710/106 |
| 2007/0030029 A1 * | 2/2007 | Ngai et al. | 326/41 |

* cited by examiner

*Primary Examiner* — Anh Tran
(74) *Attorney, Agent, or Firm* — Ward & Zinna, LLC

(57) ABSTRACT

A PLD comprises a substrate, an array of programmable logic elements formed in the substrate, a first columnar interface coupling to the array of logic elements and extending in the substrate substantially parallel to a first side of the substrate, and at least a second columnar interface coupling to the array of logic elements and extending in the substrate substantially parallel to the first columnar interface. The interfaces illustratively provide a plurality of interconnects, control circuits and one or more of driver circuits, rebuffering circuits, signal conditioning circuits, deskewing circuits, clock synchronization circuits, power management circuits, testing/debugging circuits, partial reconfiguration circuits, multi-plexing circuits, pipelining circuits and storage circuits. The PLD is mounted on an interposer so that its interfaces electrically couple to electrically conducting paths on the interposer.

19 Claims, 4 Drawing Sheets

US 8,901,961 B1

PLACEMENT, REBUFFERING AND ROUTING STRUCTURE FOR PLD INTERFACE

CROSS-REFERENCE TO RELATED APPLICATION

This application is a continuation-in-part of application Ser. No. 13/350,662, filed Jan. 13, 2012 for "Apparatus for Flexible Electronic Interfaces and Associated Methods," the entire contents of which are incorporated herein by reference.

BACKGROUND

The present invention relates generally to an electronic package. A particular application for this package is in the implementation of programmable logic devices (PLD) such as field programmable gate arrays (FPGA) and the invention will be described in that context.

A FPGA is a PLD containing a large number of small programmable logic elements, a number of input/output (I/O) terminals, and a method of specifying electrical connections between the logic elements through a distributed array of programmable switches. The programming of the logic elements and the switches is typically specified by configuration bits stored in a configuration random access memory (CRAM). A FPGA allows a design engineer to realize a design of a product by programming its connections in a specific manner without incurring the high cost of manufacturing a unique integrated circuit. A variety of FPGAs are described in S. D. Brown, R. J. Francis, J. Rose, and Z. G. Vranesic, *Field-Programmable Gate Arrays*, (Kluwer Academic Publishers 1992); J. H. Jenkins, *Designing with FPGAs and CPLDs*, (PTR Prentice-Hall 1994); J. V. Oldfield and R. C. Dorf, *Field Programmable Gate Arrays*, (Wiley-Interscience 1995).

SUMMARY

The present invention is an improved electronic package especially useful with a programmable logic device (PLD) such as a field programmable gate array (FPGA).

In a preferred embodiment of the invention, the PLD comprises a substrate, an array of programmable logic elements formed in the substrate, a first columnar interface coupling to the array of logic elements and extending in the substrate substantially parallel to a first side of the substrate, and at least a second columnar interface coupling to the array of logic elements and extending in the substrate substantially parallel to the first columnar interface but spaced apart therefrom. The first and second interfaces illustratively provide a plurality of interconnects, control circuits and one or more of driver circuits, rebuffering circuits, signal conditioning circuits, deskewing circuits, clock synchronization circuits, power management circuits, testing/debuggin circuits, multiplexing circuits, pipelining circuits, partial reconfiguration circuits, and storage circuits. Other embodiments of the invention may use more than two columnar interfaces all of which are parallel to one another but spaced apart from each other. Illustratively, the PLD is mounted on an interposer so that its interfaces electrically couple to electrically conducting paths on the interposer.

Numerous variations may be practiced in the preferred embodiment.

BRIEF DESCRIPTION OF THE DRAWINGS

These and other objects and advantages of the present invention will be apparent to those of ordinary skill in the art in view of the following detailed description in which.

DETAILED DESCRIPTION

Figure 1:
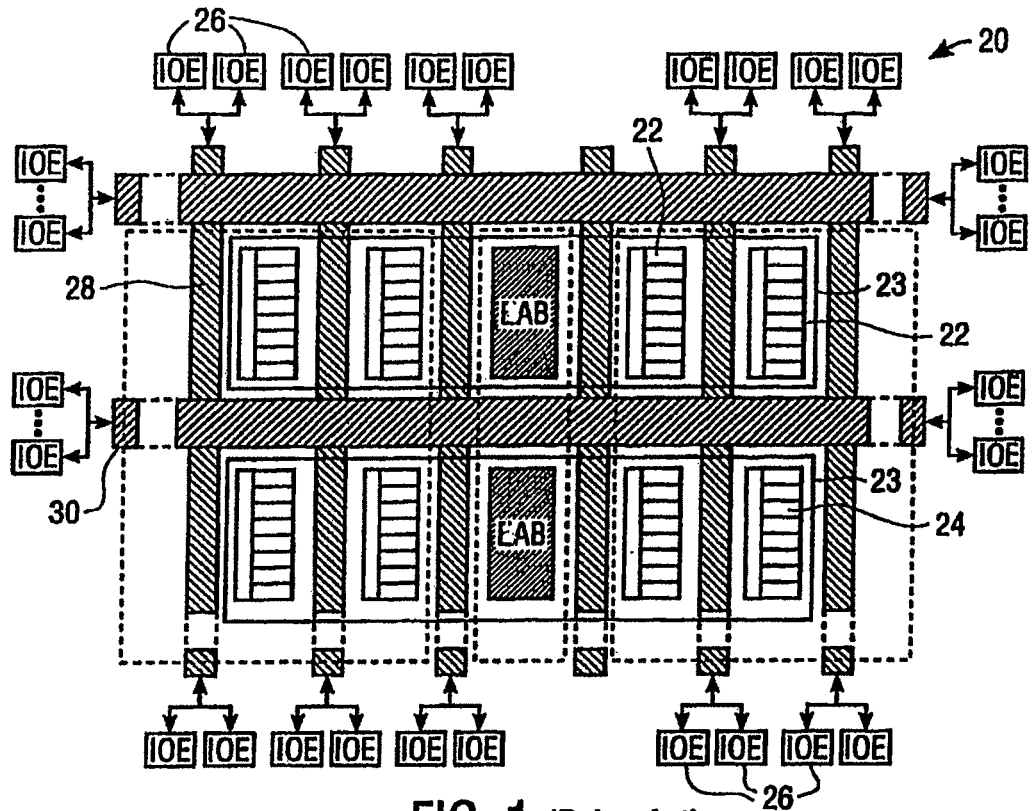
FIGS. 1 and 2 depict the layout of a programmable logic circuit.
Figure 2:
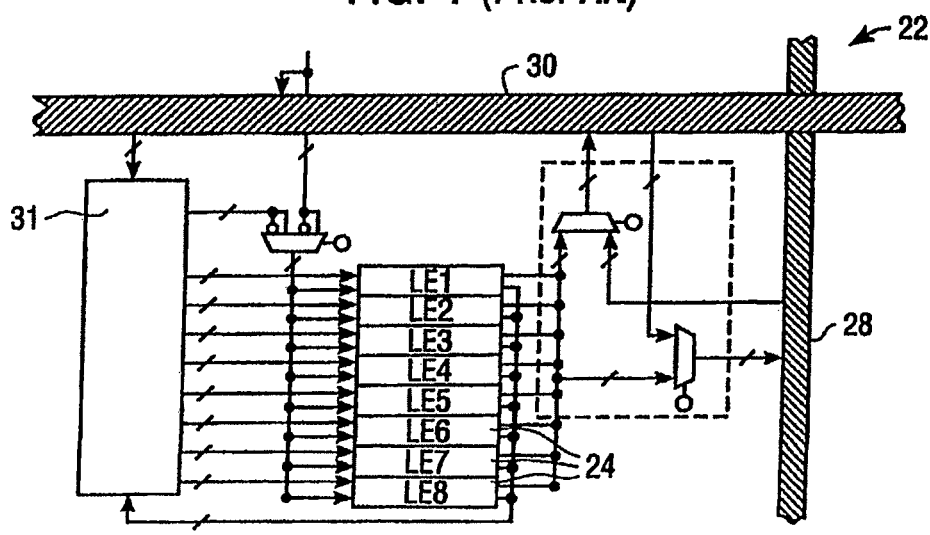

FIGS. 1 and 2 illustrate the general layout of certain FPGAs supplied by Altera Corporation, the assignee of the present application. FIG. 1 depicts a programmable logic device (PLD) 20 comprising logic array blocks (LABs) 22. Device 20 is implemented as a single integrated circuit. Each logic array block 22 comprises a group of logic elements (LEs) 24 which is frequently referred to as core logic. Around the periphery of the PLD 20 are input/output elements (IOEs) 26. Each LE 24 and IOE 26 can generate one or more signals that can be routed to other LEs 24 or IOEs 26 through vertical (or column) interconnect circuitry 28 and horizontal (or row) interconnect circuitry 30. The interconnect circuitry (or bus) is located in one or more metallization layers of the integrated circuit. As shown in FIG. 1, the vertical and horizontal interconnect circuitry 28, 30 extends across the full width of the integrated circuit in the vertical and horizontal directions, respectively. The interconnection circuits that extend the full width of the integrated circuit are often referred to as global circuits. The number of LABs 22 shown in PLD 20 of FIG. 1 is only illustrative. In practice, PLD 20 could have fewer LABs and often has more.

FIG. 2 is a more detailed view of a logic array block (LAB) 22. LAB 22 a set of logic elements (LE1-LE8). Local interconnect circuitry 31 routes signals generated within the LAB 22 (or signals generated externally to LAB 22 which have been routed to this LAB) to the LE 24 within that LAB. Multiplexers 32 provide for various connections between LAB 22 and the vertical and horizontal circuitry 28, 30. Various programmable switches (not shown), which may include multiplexers, provide a variety of interconnections among the LE.

The interface to PLD 20 conventionally is through IOEs 26 disposed on the periphery of the PLD on one or more sides. In some situations other arrangements might be desired.

Figure 3A:
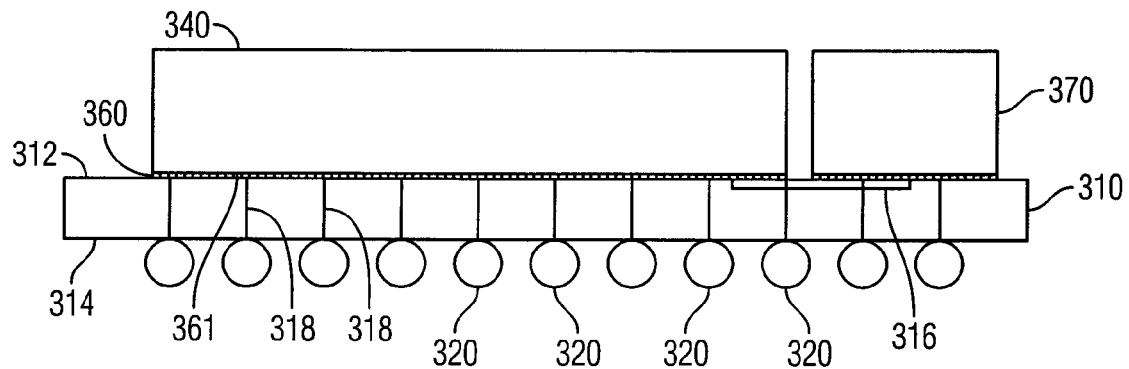
FIGS. 3A and 3B are a side view and a top view of an illustrative embodiment of the invention.
Figure 3B:
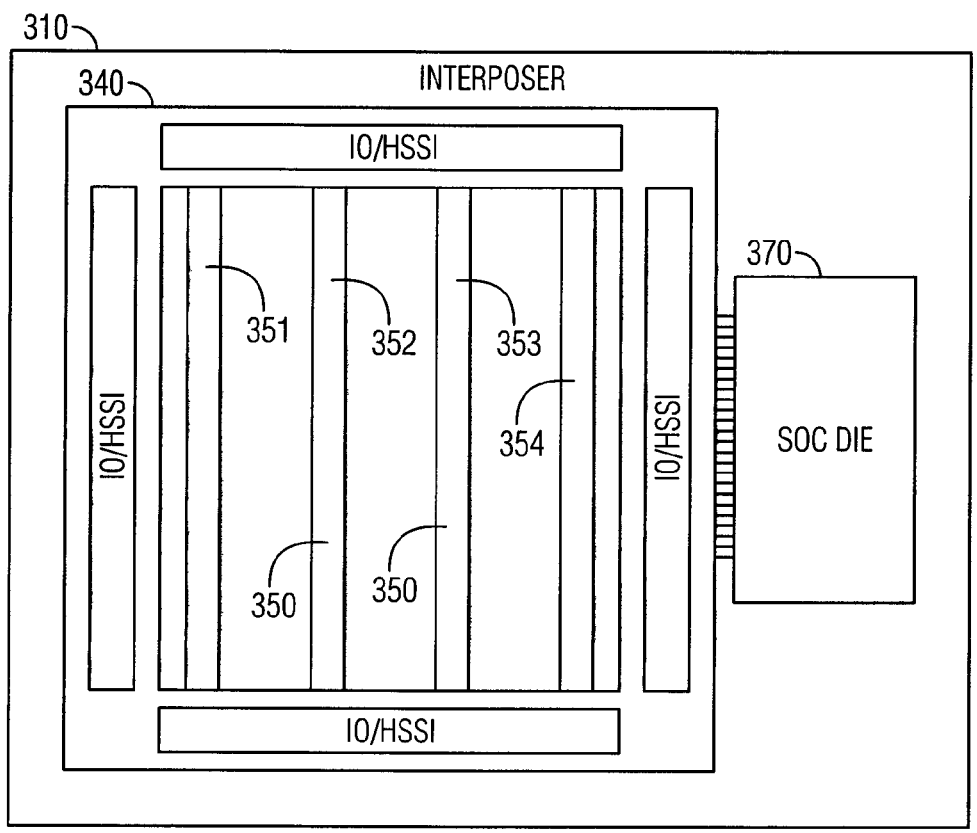

FIGS. 3A and 3B are a side view and a top view of an illustrative embodiment of the invention. FIGS. 3A and 3B depict an interposer 310, a programmable logic device (PLD) 340 mounted on interposer 310 and an additional device 370 also mounted on the interposer. Illustratively, device 370 is a system on a chip (SOC); but it could be any number of other devices that might advantageously be connected to PLD 340 through interposer 310.

Interposer 310 illustratively is a rectangular Silicon substrate having upper and lower major surfaces 312, 314. A plurality of electrically conducting paths 316 are defined on one or both surfaces 312, 314. Electrical connections between the electrically conducting paths on the two major surfaces are made by electrically conducting vias 318 that extend through interposer 310. Electrical connections 320 to other devices are provided on lower surface 314 and are electrically connected to conducting paths 316.

In other embodiments, interposer may be formed from a laminate of generally alternating layers of an insulating layer and an electrically conducting layer with electrically conducting paths defined in the electrically conducting layers as is well known in the art. Electrical connections between the electrically conducting layers are made by electrically conducting paths that extend between the electrically conducting layers through the insulating layers.

PLD 340 is an integrated circuit formed in a semiconductor material such as Silicon or Gallium Arsenide. The circuit typically is rectangular in shape and therefore has four sides, a first two of which are parallel to each other and a second two of which are parallel to each other and perpendicular to the first two sides. The PLD has a plurality of programmable logic elements such as those described above. The PLD also has a plurality of interface circuits 350 that are spaced apart from each other and extend in columns (or rows) substantially parallel to each other and to two sides of the PLD and substantially perpendicular to the other two sides of the PLD. As a result the interface circuits may be characterized as columnar or row interfaces. For purposes of illustration, four such interface circuits 351, 352, 353, 354 are shown in FIGS. 3A and 3B; but it will be understand that as few as two such interface circuits and more than four such circuits may be used in the practice of the invention. Illustratively, the interface circuits are equally spaced but other arrangements may also be used in the practice of the invention.

PLD 340 is electrically and mechanically connected to interposer 310 by interconnects 360 that typically are solder balls, solder bumps or pins. Interconnects 360 connect the interface circuits 350 on PLD 340 to the electrical paths 316 on interposer 310. More particularly, the interconnects immediately adjacent a specific interface circuit 350 connect that interface circuit to the electrical paths on interposer 310. So, for example, interconnects 361 immediately adjacent interface 351 connect that interface to paths 316.

Figure 4:
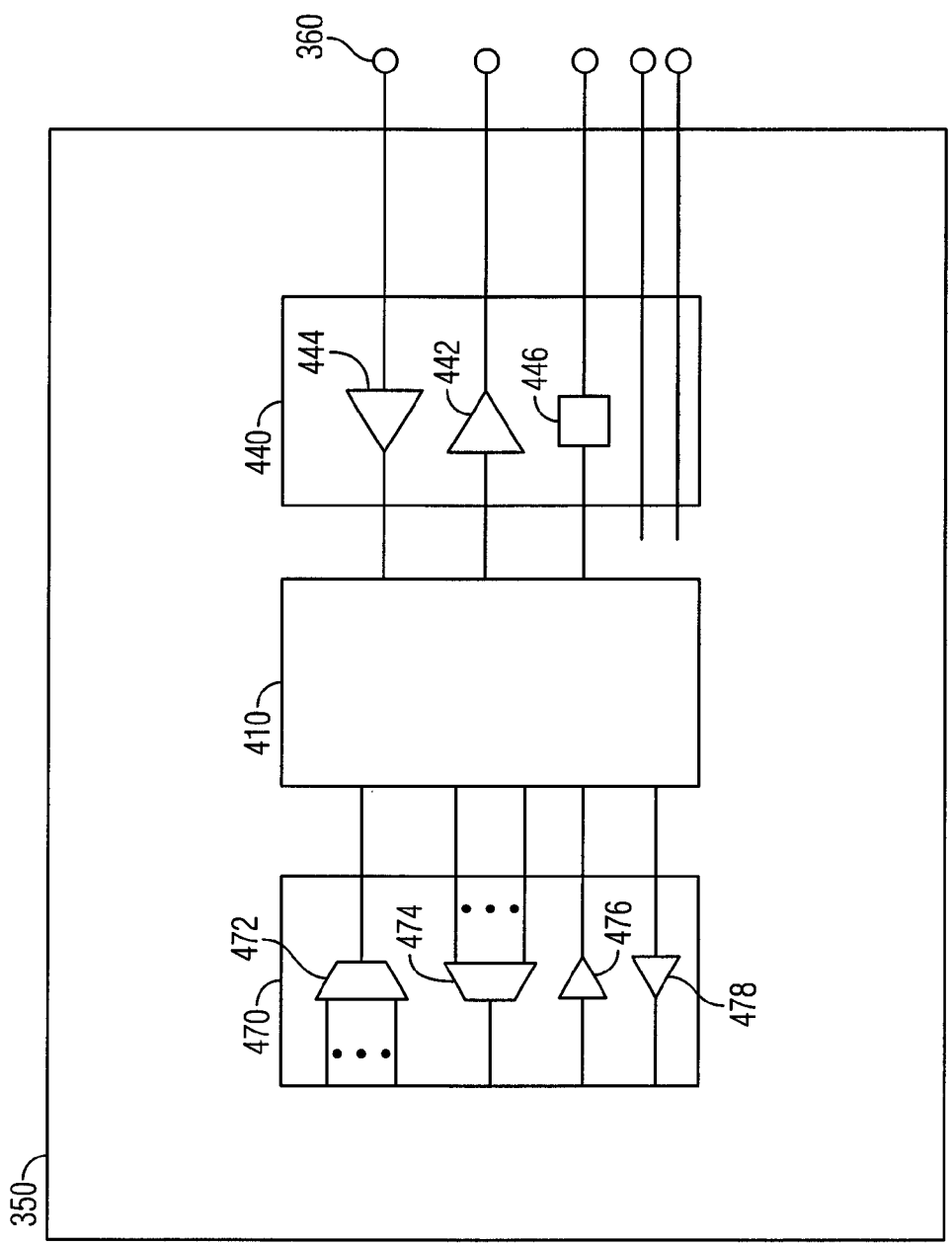
FIG. 4 is a block diagram of an interface circuit used in the embodiment of FIG. 3.

FIG. 4 is a schematic illustration of an interface circuit 350 useful in the practice of the invention. Circuit 350 comprises a controller 410, buffer circuits 440, routing interface 470 and interconnects 360.

Controller 410 couples to buffer circuits 440 and routing interface 470. Generally, controller 410 provides control and supervisory functions for interface circuits 350. For example, controller 410 may determine the timing, direction and number of signals communicated between PLD 340 and interposer 310. Controller 410 may also support one or more data or communication protocols. For example, controller may support protocols such as DDR, DDR2, DDR3, communication protocols, signaling protocols and the like.

Controller 410 may include a variety of circuitry ranging from hardened (fixed or non-programmable) to soft (fully programmable) or customizable circuitry. Thus, in some embodiments, controller 410 may include logic gates, registers, flip-flops, counters, finite state machines, hardened intellectual property (IP), memory, multiplexers, latches and the like. In some embodiments, controller 410 may include fully customizable or programmable logic, such as look-up tables, soft IP, and, generally, circuitry similar to the programmable fabric of a PLD. In yet other embodiments, controller 410 may include structured application specific integrated circuits (structured ASIC). In such embodiments, with one or more mask changes, the functionality of controller 410 may be configured, customized, or programmed, as persons of ordinary skill in the art understand. Regardless of the exact implementation, in some embodiments, controllers 410 in multiple interface circuits may be combined to provide additional flexibility, increased functionality, etc.

Buffer circuits 440 couple to some or all of the interconnects 360. Buffer circuits 440 may provide one or more of the following output functions in exemplary embodiments: buffering, level shifting (e.g., to accommodate different voltage levels of the signal source and signal destination circuits) and/or signal conditioning for signals derived from PLD 340. Buffer circuits 440 may also provide input buffer functionality by buffering, level shifting and/or conditioning signals from another device so as to provide those signals to circuitry on PLD 340, Buffer circuits may also provide bi-directional buffer functionality by buffering, level shifting and/or conditioning signals from the circuitry so as to provide a transmit those signals to circuitry on other devices, Other circuits implemented in buffer circuits 440 may include driver circuits, deskewing circuits, clock synchronization circuits, testing/debugging circuits, multiplexing circuits, partial reconfiguration circuits, pipelining circuits and storage circuits.

Buffer circuit 440 may have various programmable of configurable features to provide flexibility. For example, in some embodiments, buffer circuits 440 may have tri-state functionality. As another example, buffer circuits 440 may have fixed or programmable drive strength and/or slew rate. As shown in FIG. 4, buffer circuit 440 includes output buffers 442, input buffers 444 and bi-directional buffers 446. Optionally, buffer circuit 440 may also include circuitry for conditioning or regulating power lines and for power management.

Routing interface 470 couples to controller 110 and to circuitry in PLD 310. Interface 470 receives data signals and power from controller 410 and provides such signals and power to PLD 340. Interface 470 also receives data signals from PLD 340 and provides such signals to controller 410.

Interface 470 typically includes multiplexers 472, 474, buffers 476, 478, registers and similar circuitry. For example, as shown in FIG. 4, a multiplexer 472 under control of controller 410 is used to select one of several signals received from sources within the PLD 340 and provide the selected signal to controller 410. As another example, multiplexer 474 under control of controller 410 is used to select one of several signals received from controller 410 and provide the selected signal to circuitry in the PLD 340. Buffer (or driver) 476 may receive an input from circuitry within PLD 340 and provide an output signal to controller 410. And buffer (or driver) 478 may receive an input from controller 410 and provide an output to circuitry in PLD 340.

In some embodiments, routing interface 470 may include circuitry similar to the programmable interconnect of a PLD. In such embodiments, the functionality of the circuitry in routing interface 470 may be programmed or configured in much the same way as the routing fabric or resources of a PLD.

Figure 5A:
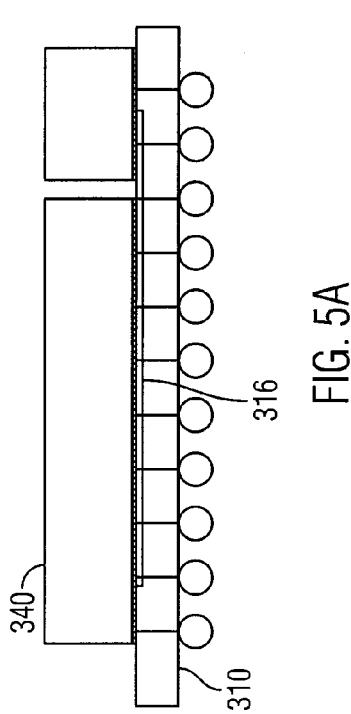
FIGS. 5A and 5B are a side view and a top view depicting one illustrative application of the invention.
Figure 5B:
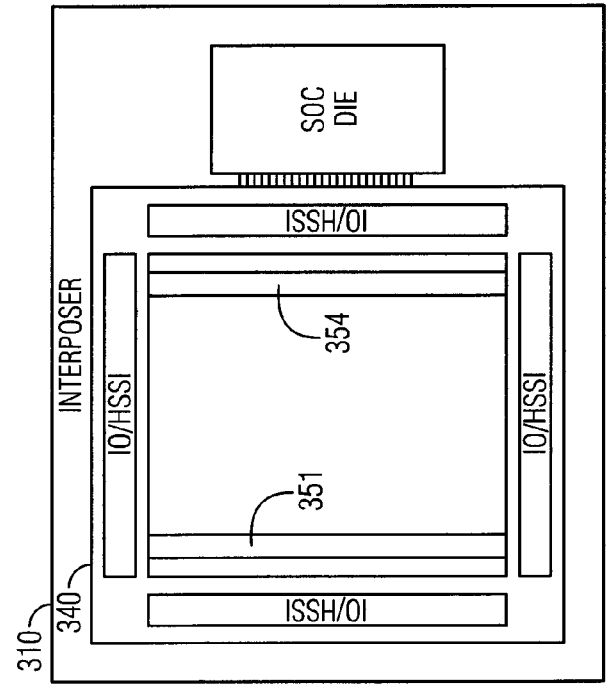

The multiple interface circuits 350 on PLD 340 make it possible to readily achieve various performance improvements on the PLD. For example, as shown schematically in FIGS. 5A and 5B, signals originating near one interface circuit 350 on PLD 340 may be routed to that interface rather than to a more remote interface or the side of the PLD and then conducted by the conducting paths 316 on the interposer to a second interface 350 on PLD 340, thereby relieving the PLD of the bandwidth requirements for routing the signals for relatively long distances on the PLD alone. Similarly, to conserve PLD resources, outbound signals from the PLD to another device can be routed to the nearest interface 350 and then through the conducting paths 316 on the interposer rather than having to go through the entire PLD; and inbound signals to the PLD can be routed through the conducting paths 316 on the interposer to the interface nearest their destination on the PLD rather than routing them through the entire PLD.

Instead of using interfaces 350 to connect PLD 340 to an interposer, interfaces 350 may be used to connect PLD 340 to the interfaces of a second, substantially identical PLD that is oriented face-to-face with PLD 340. Such an arrangement would make it possible for either PLD to couple through the interfaces to use the routing resources of the other PLD.

In still another variation, additional electrically conducting layers may be formed on the surface of the PLD and processed to form additional conducting paths on the surface of the PLD.

Figure 6:
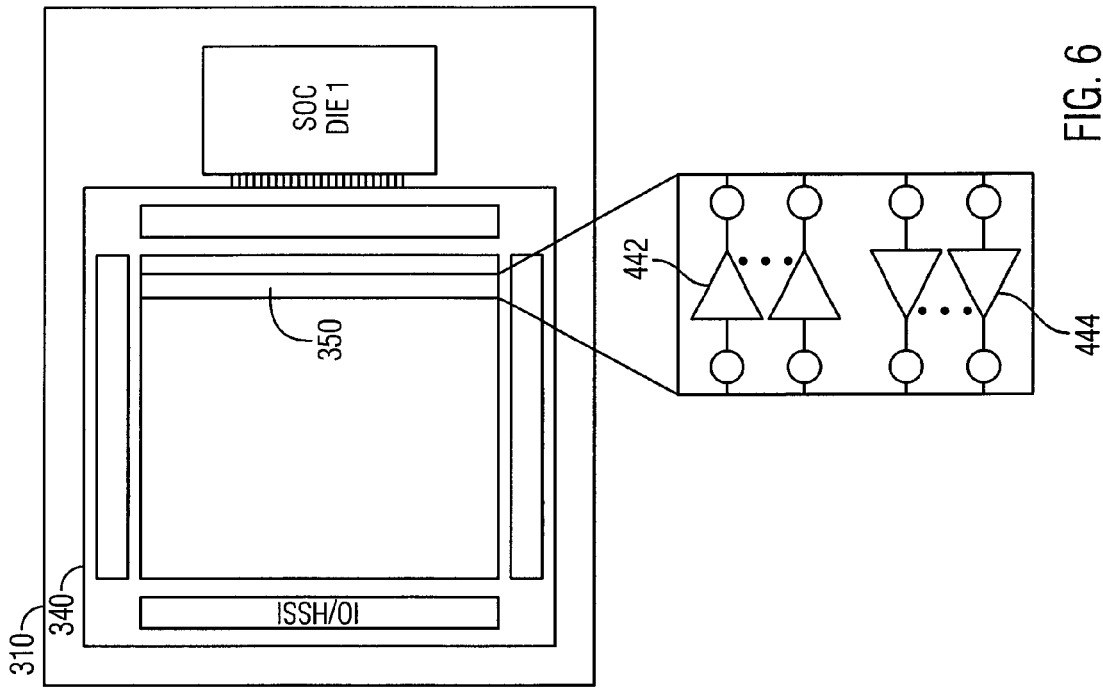
FIG. 6 is a top view depicting a second illustrative application of the invention.

As depicted schematically in FIG. 6, the interface circuits may also be used for various signal processing functions. For example, the output and input buffers 442, 444 in each of the interfaces may be used for rebuffering signals propagating through these interfaces, thereby improving the performance and bandwidth of these circuits.

As will be apparent to those skilled in the art, numerous variations may be practiced within the spirit and scope of the present invention.

What is claimed is:

1. An electronic device comprising:
    an interposer including a plurality of electrically conducting paths;
    a programmable logic device (PLD) electrically and mechanically mounted on the interposer;
    a first columnar interface coupled to the PLD and extending in a first direction in the PLD; and
    a second columnar interface coupled to the PLD and extending in the PLD substantially parallel to the first columnar interface but spaced-apart therefrom, the first and second columnar interfaces being coupled together by at least one of the electrically conducting paths of the interposer.

2. The electronic device of claim 1 further comprising a third columnar interface coupling to the array of logic elements and extending in the substrate substantially parallel to the first and second columnar interfaces but spaced apart therefrom.

3. The electronic device of claim 1 further comprising third and fourth columnar interfaces coupling to the array of logic elements and extending in the substrate substantially parallel to the first and second columnar interfaces but spaced apart therefrom.

4. The electronic device of claim 1 further comprising third and fourth columnar interfaces coupling to the array of logic elements and extending in the substrate substantially parallel to the first and second columnar interfaces where the first and second columnar interfaces are along opposite sides of the substrate and the third and fourth columnar interfaces are approximately equally spaced between the first and second columnar interfaces.

5. The electronic device of claim 1 wherein the first and second columnar interfaces comprise driver circuits.

6. The electronic device of claim 1 wherein the first and second columnar interfaces comprise rebuffering circuits.

7. The electronic device of claim 1 wherein the first and second columnar interfaces comprise signal conditioning circuits.

8. The electronic device of claim 1 wherein the first and second columnar interfaces comprise deskewing circuits.

9. The electronic device of claim 1 wherein the first and second columnar interfaces comprise multiplexing circuits.

10. The electronic device of claim 1 wherein the first and second columnar interfaces comprise pipelining circuits.

11. The electronic device of claim 1 wherein the first and second columnar interfaces comprise storage circuits.

12. The electronic device of claim 1 wherein the first and second columnar interfaces comprise one or more of clock synchronization circuits, power management circuits, testing/debugging circuits and partial reconfiguration circuits.

13. The electronic device of claim 1 wherein the PLD is a field programmable gate array (FPGA).

14. An electronic device comprising:
    an interposer including a plurality of electrically conducting paths;
    a semiconductor substrate electrically and mechanically mounted on the interposer;
    a first array of programmable logic elements formed in the substrate;
    a first columnar interface coupled to the array of logic elements and extending in a first direction in the substrate; and
    a second columnar interface coupled to the array of logic elements and extending in the substrate substantially parallel to the first columnar interface but spaced-apart therefrom, the first and second columnar interfaces being coupled together by at least one of the electrically conducting paths of the interposer.

15. The electronic device of claim 14 further comprising a third columnar interface coupling to the array of logic elements and extending in the substrate substantially parallel to the first and second columnar interfaces but spaced apart therefrom.

16. The electronic device of claim 14 further comprising third and fourth columnar interfaces coupling to the array of logic elements and extending in the substrate substantially parallel to the first and second columnar interfaces but spaced apart therefrom.

17. The electronic device of claim 14 further comprising third and fourth columnar interfaces coupling to the array of logic elements and extending in the substrate substantially parallel to the first and second columnar interfaces where the first and second columnar interfaces are along opposite sides of the substrate and the third and fourth columnar interfaces are approximately equally spaced between the first and second columnar interfaces.

18. The electronic device FPGA of claim 14 wherein the first and second columnar interfaces comprise one or more of driver circuits, rebuffering circuits, signal conditioning circuits, deskewing circuits, clock synchronization circuits, power management circuits, testing/debugging circuits, partial reconfiguration circuits, multiplexing circuits, pipelining circuits and storage circuits.

19. The electronic device of claim 1 further comprising third and fourth columnar interfaces coupling to the PLD and extending in the PLD substantially parallel to the first and second columnar interfaces but spaced apart therefrom.

* * * * *